United States Patent
Kim et al.

(10) Patent No.: US 10,641,787 B2
(45) Date of Patent: May 5, 2020

(54) CAPACITANCE SENSOR AND DIRECTION DETECTION DEVICE INCLUDING SAME

(71) Applicant: LG INNOTEK CO., LTD., Seoul (KR)

(72) Inventors: Jeong Han Kim, Seoul (KR); Won Keun Cho, Seoul (KR); Bi Yi Kim, Seoul (KR); Hyun Gyu Park, Seoul (KR); In Hee Cho, Seoul (KR); Seung Kwon Hong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 139 days.

(21) Appl. No.: 15/749,874

(22) PCT Filed: Jul. 28, 2016

(86) PCT No.: PCT/KR2016/008298
§ 371 (c)(1),
(2) Date: Feb. 2, 2018

(87) PCT Pub. No.: WO2017/023016
PCT Pub. Date: Feb. 9, 2017

(65) Prior Publication Data
US 2018/0231578 A1 Aug. 16, 2018

(30) Foreign Application Priority Data
Aug. 3, 2015 (KR) .................. 10-2015-0109565

(51) Int. Cl.
*G01R 27/06* (2006.01)
*G01P 13/00* (2006.01)
(Continued)

(52) U.S. Cl.
CPC ............ *G01P 13/00* (2013.01); *G01D 5/2417* (2013.01); *G01P 13/02* (2013.01); *G01R 21/12* (2013.01);
(Continued)

(58) Field of Classification Search
CPC .... G01R 27/2605; G01R 27/02; G01R 21/12; G01R 35/00; G01R 27/14; G01R 31/2648; G01R 31/2837; G01R 3/00
(Continued)

(56) References Cited

U.S. PATENT DOCUMENTS

2007/0210709 A1* 9/2007 Yim .................. H01J 11/18
313/582
2011/0248310 A1* 10/2011 Cheng ............... H01L 21/76898
257/99
(Continued)

FOREIGN PATENT DOCUMENTS

JP 2000-131162 5/2000
JP 2012-013458 1/2012
(Continued)

OTHER PUBLICATIONS

JP 2000-131162 Machine Translation, May 12, 2000 (Year: 2000).*
(Continued)

*Primary Examiner* — Raul J Rios Russo
(74) *Attorney, Agent, or Firm* — KED & Associates, LLP

(57) ABSTRACT

A direction detecting device according to an exemplary embodiment of the present invention includes; a structure having at least two through-holes passing through an upper surface and a lower surface thereof; and at least two electrode units inserted into the at least two through-holes and each including a dielectric layer, a first electrode layer disposed on an upper surface of the dielectric layer and exposed at the upper surface of the structure, and a second electrode layer disposed on a lower surface of the dielectric layer and exposed at the lower surface of the structure.

20 Claims, 16 Drawing Sheets

(51) Int. Cl.
  *G01P 13/02*   (2006.01)
  *G01R 27/26*   (2006.01)
  *G01R 27/02*   (2006.01)
  *G01R 35/00*   (2006.01)
  *G01R 21/12*   (2006.01)
  *G01R 31/26*   (2020.01)
  *G01R 27/14*   (2006.01)
  *G01D 5/241*   (2006.01)
  *G01R 31/28*   (2006.01)
  *G01R 3/00*    (2006.01)

(52) U.S. Cl.
  CPC ............ *G01R 27/02* (2013.01); *G01R 27/14* (2013.01); *G01R 27/2605* (2013.01); *G01R 31/2648* (2013.01); *G01R 35/00* (2013.01); *G01R 3/00* (2013.01); *G01R 31/2837* (2013.01)

(58) Field of Classification Search
  USPC .......... 324/76.11–76.83, 600, 649, 658, 661
  See application file for complete search history.

(56) References Cited

U.S. PATENT DOCUMENTS

2016/0064146 A1* 3/2016 Ahn .................. H01G 4/30
                                              361/301.4
2017/0315165 A1* 11/2017 Kawaguchi ........ G01R 27/2605

FOREIGN PATENT DOCUMENTS

| | | |
|---|---|---|
| JP | 4942470 | 5/2012 |
| JP | 2012-194112 | 10/2012 |
| KR | 10-1017096 | 2/2011 |

OTHER PUBLICATIONS

KR 10-1017096 Machine Translation, Feb. 25, 2011 (Year: 2011).*
International Search Report (with English Translation) and Written Opinion dated Nov. 8, 2016 issued in Application No. PCT/KR2016/008298.

* cited by examiner

DIRECTION A

CAPACITANCE SENSOR AND DIRECTION DETECTION DEVICE INCLUDING SAME

This application is a U.S. National Stage Application under 35 U.S.C. § 371 of PCT Application No. PCT/KR2016/008298, filed Jul. 28, 2016, which claims priority to Korean Patent Application No. 10-2015-0109565, filed Aug. 3, 2015, whose entire disclosures are hereby incorporated by reference.

TECHNICAL FIELD

The present invention relates to a capacity sensor and a direction detecting device including the same, and more particularly, to a sheet or mat-type direction detecting device.

BACKGROUND ART

Generally, a function of detecting a direction has been applied to devices, such as image displays, vehicles, and electronic devices, to merely focus on performing an additional function.

Recently, there has been a need for a direction detecting device in various application fields as well as home safety devices. For example, the direction detecting device may be installed at the entrance of a building to detect whether there are people in the building, thereby automatically cutting off electricity, a gas, or the like.

However, there are limitations in developing new technologies for detecting a direction.

DISCLOSURE

Technical Problem

The present invention is directed to providing a capacity sensor having improved sensing performance to accurately sense a change in capacitance, and a direction detecting device including the same.

Technical Solution

One aspect of the present invention provides a capacity sensor including: a structure having at least two through-holes passing through an upper surface and a lower surface thereof; and at least two electrode units disposed in the at least two through-holes, wherein each of the at least two electrode units includes: a dielectric layer; a first electrode layer disposed on an upper surface of the dielectric layer and exposed at the upper surface of the structure; and a second electrode layer disposed on a lower surface of the dielectric layer and exposed at the lower surface of the structure.

A time at which capacitance of the dielectric layer in a first electrode unit of the at least two electrode units is changed may be different from a time at which capacitance of the dielectric layer in a second electrode unit of the at least two electrode units is changed.

Any one of an upper surface and a lower surface of the electrode unit may have at least one of a bar shape, a zigzag shape, and a wave shape.

The electrode unit may be in complete contact with a side surface of the through-hole.

The at least two through-holes may have the same width.

The at least two through-holes may have different widths.

Another aspect of the present invention provides a direction detecting device including: a structure having at least two through-holes passing through an upper surface and a lower surface thereof; a capacity sensor including at least two electrode units disposed in the at least two through-holes; and a direction sensor connected to the capacity sensor to sense a movement direction, wherein each of the at least two electrode units includes: a dielectric layer; a first electrode layer disposed on an upper surface of the dielectric layer and exposed at the upper surface of the structure; and a second electrode layer disposed on a lower surface of the dielectric layer and exposed at the lower surface of the structure.

The direction sensor may determine that an object moves toward an electrode unit, in which a change in capacitance occurs later than other electrode units, of the at least two electrode units.

A time at which capacitance of the dielectric layer in a first electrode unit of the at least two electrode units is changed may be different from a time at which capacitance of the dielectric layer in a second electrode unit of the at least two electrode units is changed.

When the capacitance of the dielectric layer in the first electrode unit of the at least two electrode units is changed at a first time (T1) and the capacitance of the dielectric layer in the second electrode unit of the at least two electrode units is changed at a second time (T2) (here, T2>T1), it may be determined that an object moves from the first electrode unit to the second electrode unit.

An upper surface of the electrode unit may have a shape selected from a bar shape, a zigzag shape, and a wave shape.

The electrode unit may be in complete contact with a side surface of through-hole.

The at least two through-holes may have the same width.

The at least two through-holes may have different widths.

Advantageous Effects

A capacity sensor and a direction detecting device including the same according to exemplary embodiments of the present invention have the following effects.

First, the misalignment between a dielectric layer of an electrode unit, a first electrode layer, and a second electrode layer can be prevented.

Second, a manufacturing process can be simplified, thereby reducing manufacturing costs.

MODES OF THE INVENTION

Figure 1A:
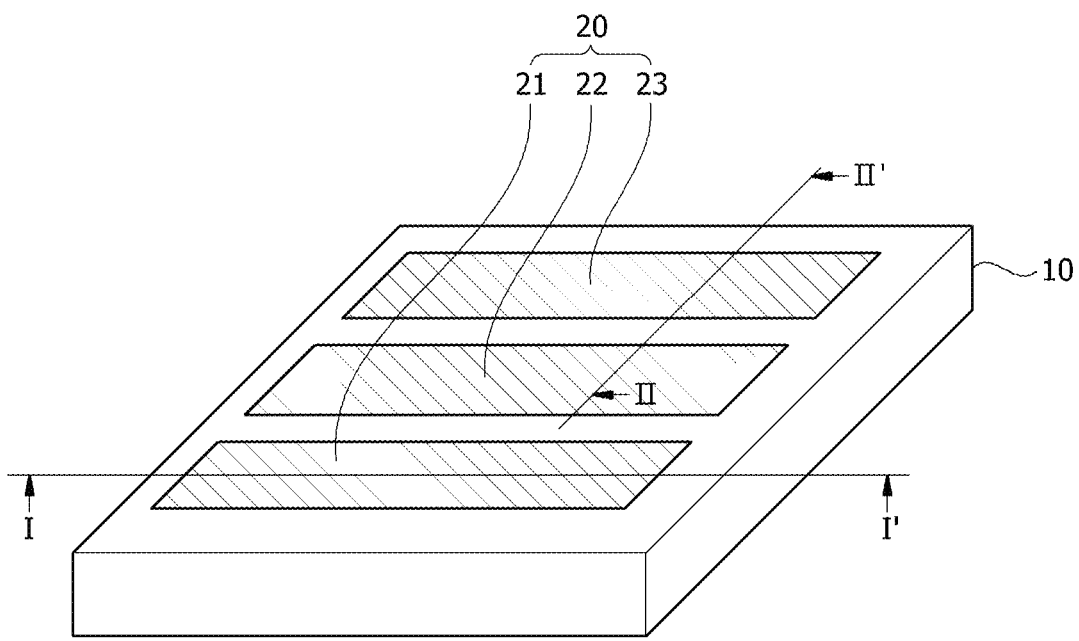
FIG. 1A is a perspective view illustrating a capacity sensor according to an exemplary embodiment of the present invention.

The present invention may be modified in various forms and have various embodiments, and thus particular embodiments thereof will be illustrated in the accompanying drawings and described in the detailed description. However, it should be understood that the description set forth herein is not intended to limit the present invention, and encompasses all modifications, equivalents, and substitutions that do not depart from the spirit and scope of the present invention.

Although the terms encompassing ordinal numbers such as first, second, etc. may be used to describe various elements, the elements are not limited by the terms. The terms are only used for the purpose of distinguishing one element from another. For example, a first element could be termed a second element, and, similarly, a second element could be termed a first element without departing from the scope of the present invention. The term "and/or" includes any and all combinations of a plurality of associated listed items.

In a case that one component is mentioned as "connected to" or "accessing" another component, it may be connected to or access the corresponding component directly.

Yet, new component(s) may exist therebetween. On the other hand, in a case that one component is mentioned as "directly connected to" or "directly accessing" another component, it should be understood that new component(s) may not exist therebetween.

The terminology provided herein is merely used for the purpose of describing particular embodiments, and is not intended to be limiting of the exemplary embodiments of the present invention. As used herein, the singular forms "a," "an," and "the," are intended to include the plural forms as well, unless the context clearly indicates otherwise. It should be understood that the terms "comprises," "comprising," "includes," and/or "including" used herein specify the presence of stated features, integers, steps, operations, elements, components and/or combinations thereof, but do not preclude the presence or addition of one or more other features, integers, steps, operations, elements, components and/or combinations thereof.

Unless defined otherwise, all the terms (including technical and scientific terms) used herein have the same meaning as commonly understood by one of ordinary skill in the art to which the present invention belongs. It will be further understood that the terms, such as those defined in commonly used dictionaries, should be interpreted as having meanings that are consistent with their meanings in the context of the relevant art, and will not be interpreted in an idealized or overly formal sense unless expressly defined otherwise herein.

Hereinafter, exemplary embodiments of the present invention will be described in detail with reference to the accompanying drawings. Regardless of reference numerals, like numbers refer to like elements throughout the description of the figures, and the description of the same elements will be not reiterated.

Hereinafter, a capacity sensor according to exemplary embodiments will be described in detail with reference to the accompanying drawings.

Figure 1B:
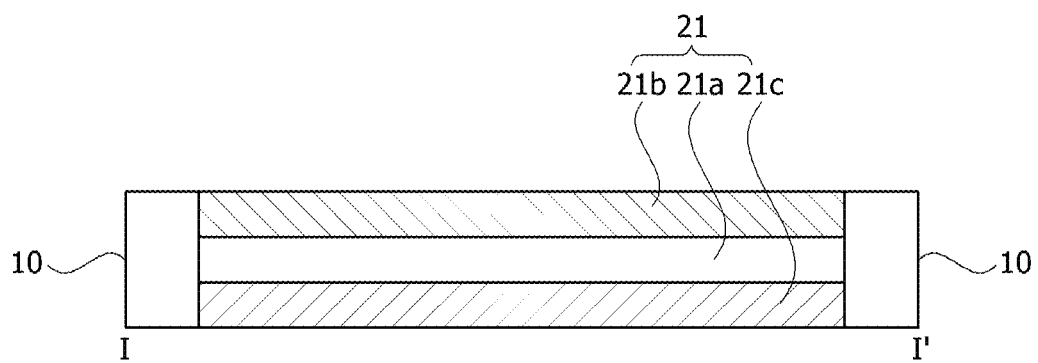
FIG. 1B is a cross-sectional view taken along line I-I' of FIG. 1A.

FIG. 1A is a perspective view illustrating a capacity sensor according to an exemplary embodiment of the present invention. FIG. 1B is a cross-sectional view taken along line I-I' of FIG. 1A, and FIG. 1C is a cross-sectional view taken along line of FIG. 1A.

Figure 1C:
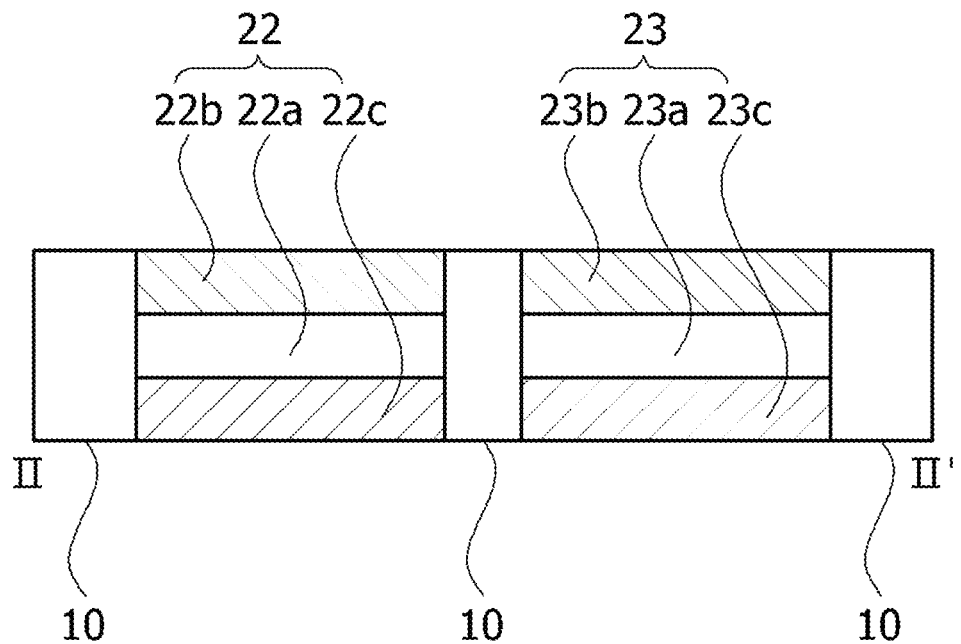
FIG. 1C is a cross-sectional view taken along line of FIG. 1A.

As shown in FIGS. 1A to 1C, a capacity sensor 110 according to the embodiment has a structure in which a plurality of electrode units 20 are inserted into through-holes of a structure 10. The structure 10 includes at least two through-holes passing through upper and lower surfaces thereof. The electrode units 20 are inserted into the through-holes. At least two electrode units 20 are provided, and first, second, and third electrode units 21, 22, and 23 are illustrated in the drawings.

The electrode units 20 include dielectric layers 21a, 22a, and 23a made of a first dielectric material, first electrode layers 21b, 22b, and 23b disposed on upper surfaces of the dielectric layers 21a, 22a, and 23a, and second electrode layers 21c, 22c, and 23c disposed on lower surfaces of the dielectric layers 21a, 22a, and 23a. Here, the first electrode layers 21b, 22b, and 23b are disposed in the through-holes and are exposed at the upper surface of the structure 10. The second electrode layers 21c, 22c, and 23c are disposed in the through-holes and are exposed at the lower surface of the structure 10.

When pressure is externally applied to the above-described capacity sensor 110, a change in capacitance is generated in a region applied with the pressure, i.e., the dielectric layers 21a, 22a, and 23a between the first electrode layers 21b, 22b, and 23b and the second electrode layers 21c, 22c, and 23c. Here, external pressure may be generated, for example, by a foot of a person. That is, when a person steps across the capacity sensor 110, a change in capacitance is generated in the dielectric layers 21a, 22a, and 23a by a pressure of the person.

Since the capacity sensor 110 should be restored after pressure is applied thereto, the dielectric layers 21a, 22a, and 23a and the structure 10 are made of a material having elasticity. In particular, the structure 10 may include the first dielectric material or a second dielectric material different from the first dielectric material.

Meanwhile, all of the first, second, and third electrode units 21, 22, and 23 are illustrated in the drawings as having the same width, but the first, second, and third electrode units 21, 22, and 23 may have different widths. In addition, the first, second, and third electrode units 21, 22, and 23 are illustrated in the drawings as having a bar shape, but may have various shapes.

Figure 2A:
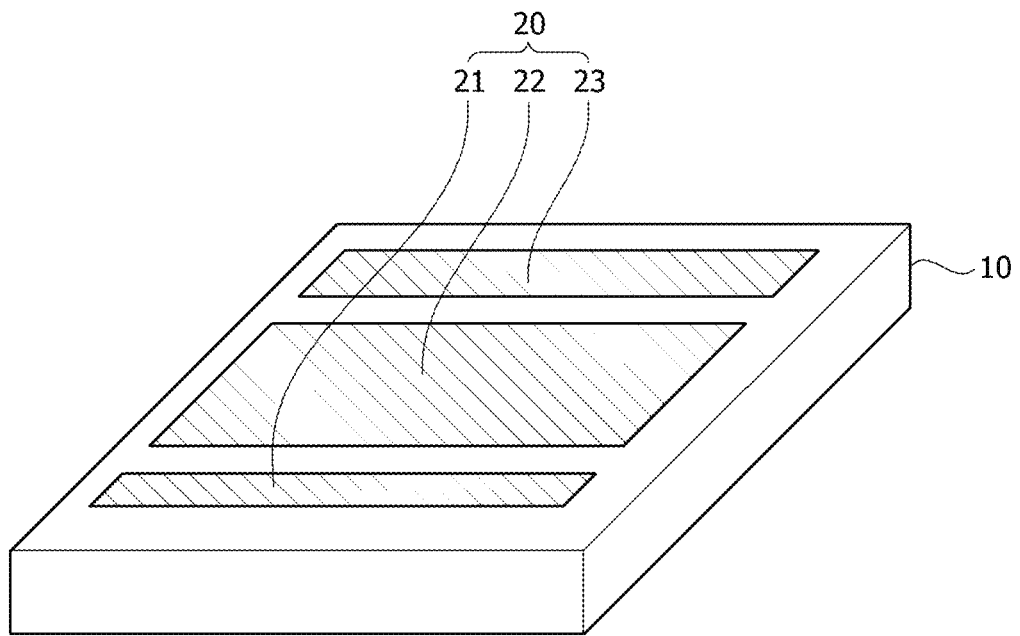
FIGS. 2A to 2C are perspective views illustrating a capacity sensor according to another exemplary embodiment of the present invention.
Figure 2B:
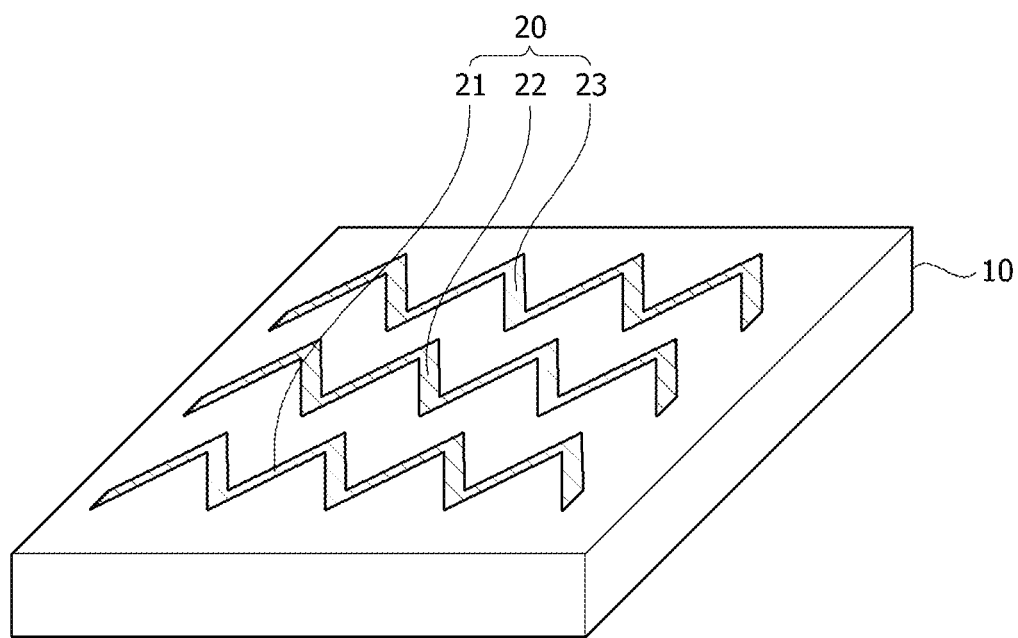
Figure 2C:
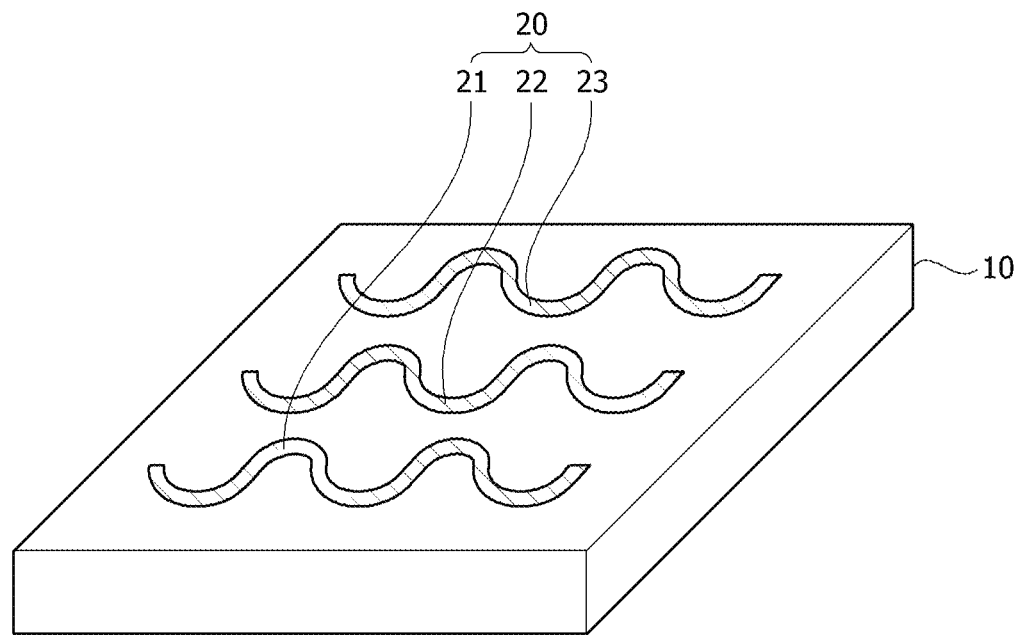

FIGS. 2A to 2C are perspective views illustrating a capacity sensor according to another exemplary embodiment of the present invention.

As shown in FIG. 2A, first, second, and third electrode units 21, 22, and 23 may have different widths. Although not shown, a width of each of the first and third electrode units 21 and 23 at an edge of the capacity sensor may be smaller than a width of the second electrode unit 22 at a center of the capacity sensor such that the front or a heel of a foot applies pressure to at least two of the first, second, and third electrode units 21, 22, and 23 even when a person only steps on the edge of the capacity sensor.

In addition, the first, second, and third electrode units 21, 22, and 23 may have a zigzag shape as shown in FIG. 2B or a wave shape as shown in FIG. 2C. The above-described shape of the first, second, and third electrode units 21, 22, and 23 is not limited thereto.

Hereinafter, a method of manufacturing a capacity sensor according to exemplary embodiments of the present invention will be described in detail.

FIGS. 3A to 3D are perspective views illustrating a method of manufacturing a capacity sensor.

Figure 3A:
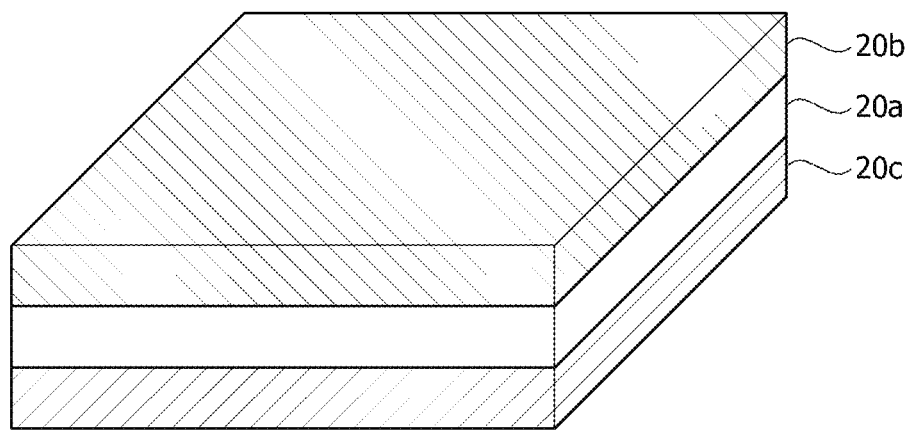
FIGS. 3A to 3D are perspective views illustrating a method of manufacturing a capacity sensor.

As shown in FIG. 3A, an electrode structure is formed by sequentially stacking a second electrode material 20c, a first dielectric material 20a, and a first electrode material 20b. In this case, the first and second electrode materials 20b and 20c may be the same or different from each other and may include a material having conductivity for a change in capacitance of the first dielectric material 20a. For example, the first and second electrode materials 20b and 20c may be a metal material such as Ag, Ni, Al, Mg, or the like, or may be an oxide such as IZO, IZTO, IAZO, IGZO, IGTO, AZO, ATO, or the like, but are not limited thereto.

When external pressure is applied to the first and second electrode materials 20b and 20c, a thickness of the first dielectric material 20a is changed between the first electrode material 20b and the second electrode material 20c, applied with the external pressure. As a result, the capacitance of the first dielectric material 20a is changed. Since the first dielectric material 20a should be restored after pressure is released therefrom, the first dielectric material 20a may be a material having elastic restoring force. In particular, when the thickness of the first dielectric material 20a is not restored to an initial thickness within three seconds after the thickness is reduced by 50% or more by pressure, it is not easy to measure a change in capacitance.

That is, when the first dielectric material 20a is too thin or thick, a capacitance value may be difficult to measure, or the first dielectric material 20a may be deformed by pressure and thus may not be restored. Therefore, the first dielectric material 20a may have a thickness of 0.5 mm to 30 mm.

Figure 3B:
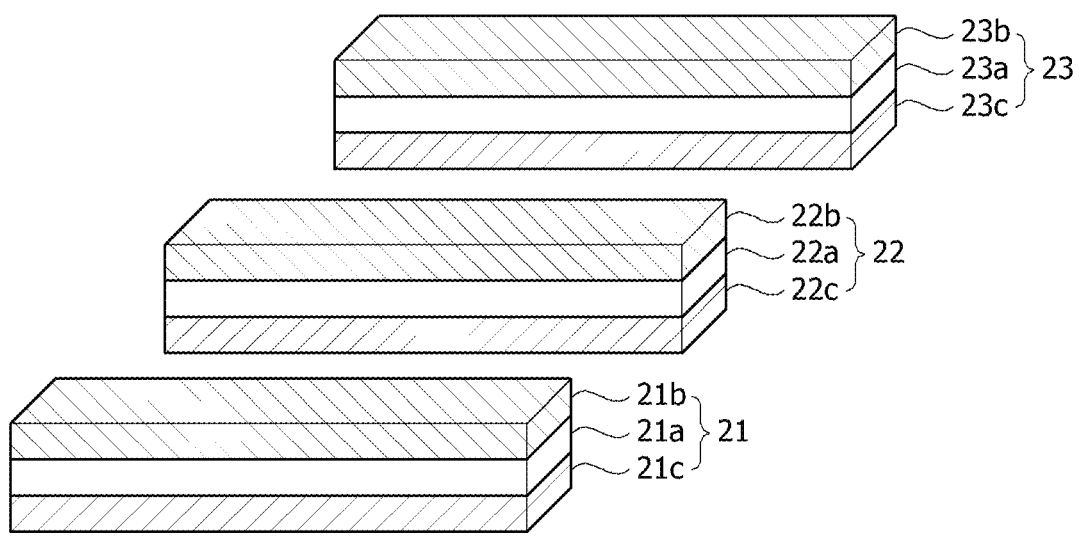

As shown in FIG. 3B, the electrode structure is divided into at least two electrode units. The electrode structure is illustrated in the drawing as being divided into first, second, and third electrode units 21, 22, and 23. Each of the first, second, and third electrode units 21, 22, and 23 has a structure in which one of second electrode layers 21c, 22c, and 23c, one of dielectric layers 21a, 22a, and 23a, and one of first electrode layers 21b, 22b and 23b are sequentially stacked.

Figure 3C:
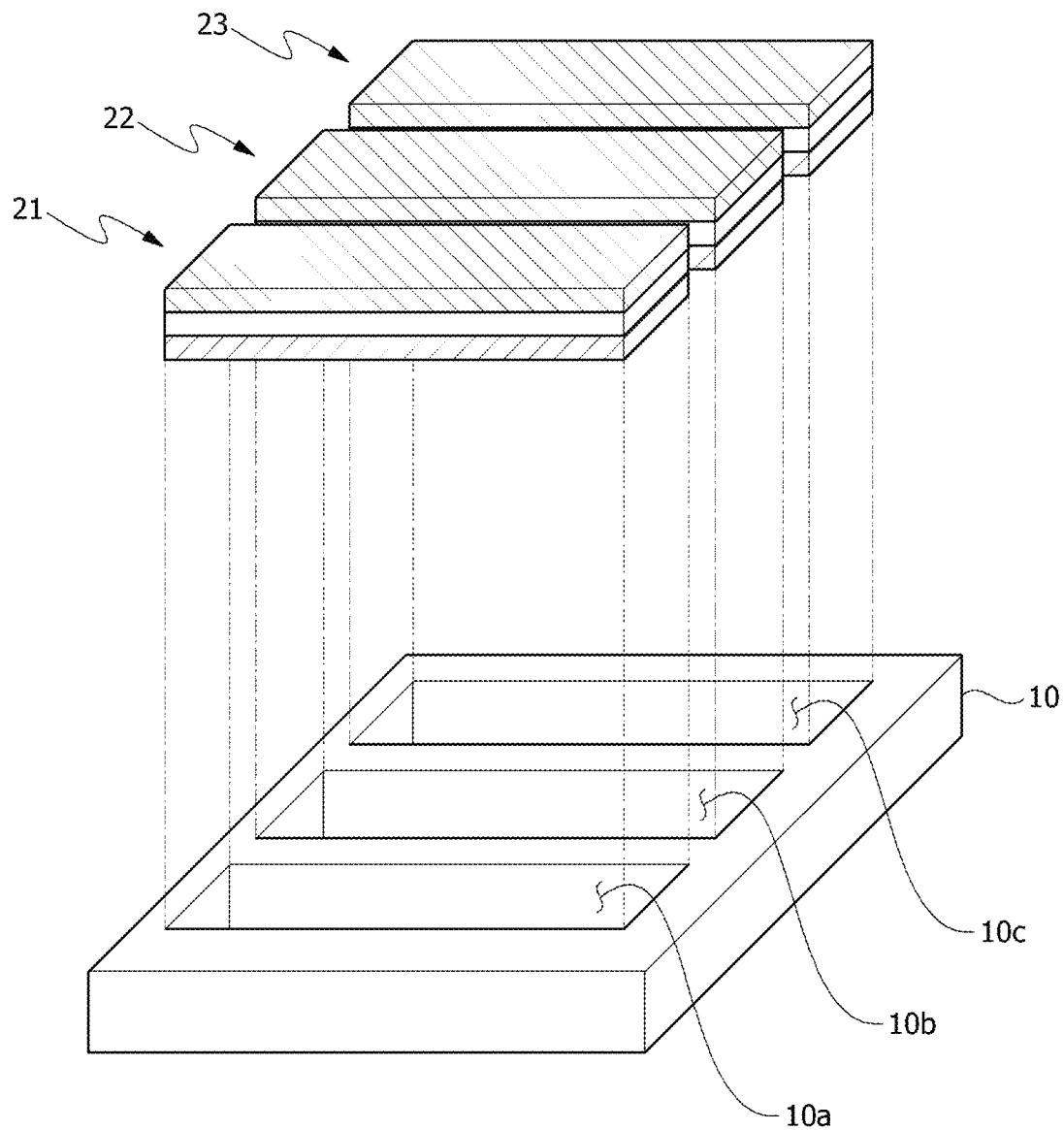

Next, as shown in FIG. 3C, a structure 10 is provided to have through-holes 10a, 10b, and 10c passing through upper and lower surfaces thereof. At least two through-holes are provided. The structure 10 may be made of a first dielectric material or a second dielectric material different from the first dielectric material and may be made of a material having elasticity. The first, second, and third electrode units 21, 22, and 23 are inserted into the through-holes 10a, 10b, and 10c, respectively. Here, the number of the through-holes 10a, 10b, and 10c formed in the structure 10 is the same as the number of the first, second, and third electrode units 21, 22, and 23. Widths of the through-holes 10a, 10b, and 10c are the same as widths of the first, second, and third electrode units 21, 22, and 23, respectively.

Figure 3D:
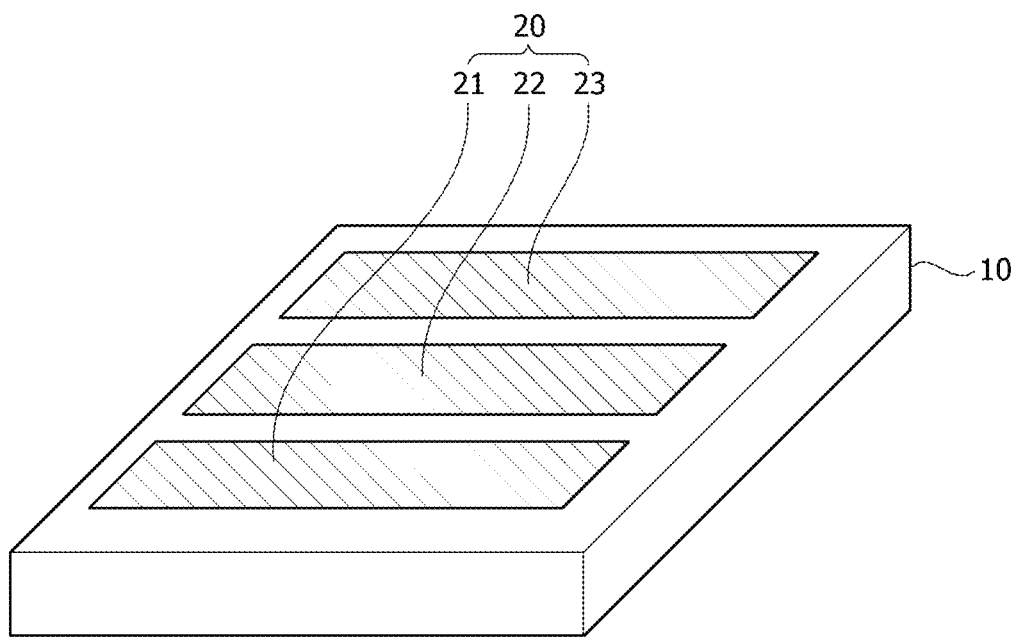

As shown in FIG. 3D, the first and second electrode layers 21b and 21c of the first electrode unit 21, the first and second electrode layers 22b and 22c of the second electrode unit 22, and the first and second electrode layers 23b and 23c of the third electrode unit 23 are disposed in the through-holes 10a, 10b, and 10c, respectively. Accordingly, the first electrode layers 21b, 22b, and 23b are exposed at the upper surface of the structure 10, and the second electrode layers 21c, 22c, and 23c are exposed at the lower surface of the structure 10. In addition, the first, second, and third electrode units 21, 22, and 23 may be in complete contact with side surfaces of the through-holes 10a, 10b, and 10c and thus may be fixed to the structure 10.

Since the capacity sensor according to the exemplary embodiments of the present invention is manufactured by respectively inserting the first, second, and third electrode units 21, 22, and 23 into the through-holes 10a, 10b, and 10c of the structure 10, a manufacturing process thereof is simple. In addition, according to the capacity sensor according to the exemplary embodiments of the present invention, the misalignment between the second electrode layers 21c, 22c, and 23c, and the first electrode layers 21b, 22b, and 23b can be prevented, thereby accurately sensing a change in capacitance.

Furthermore, the above-described capacity sensor may be manufactured through other methods.

Figure 4A:
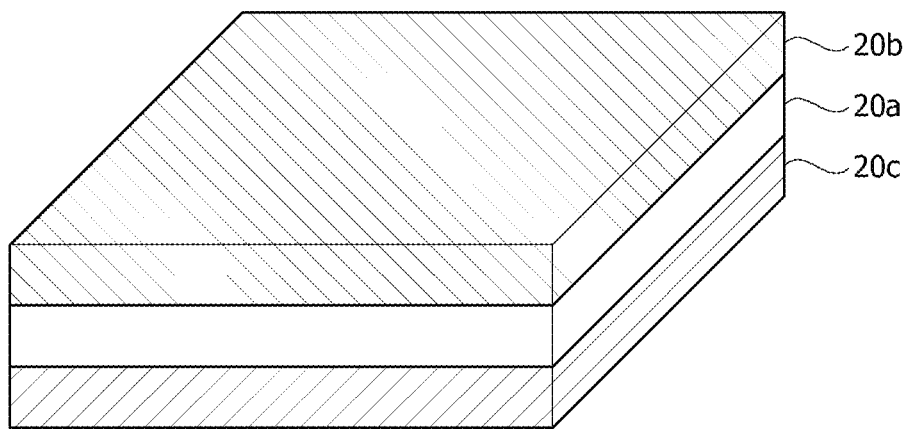
FIGS. 4A to 4E are perspective views illustrating a method of manufacturing a capacity sensor, according to another exemplary embodiment.
Figure 4B:
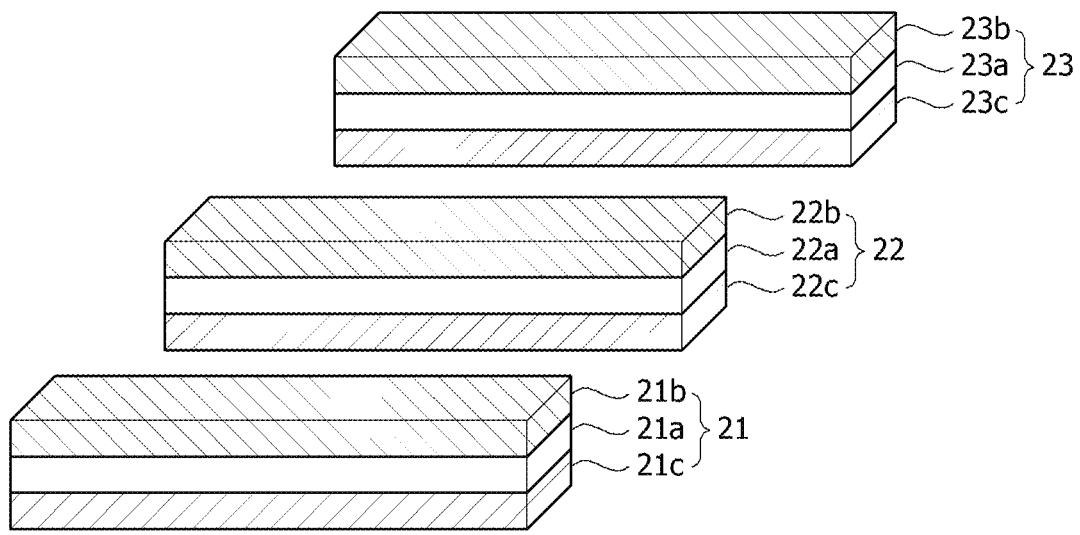
Figure 4C:
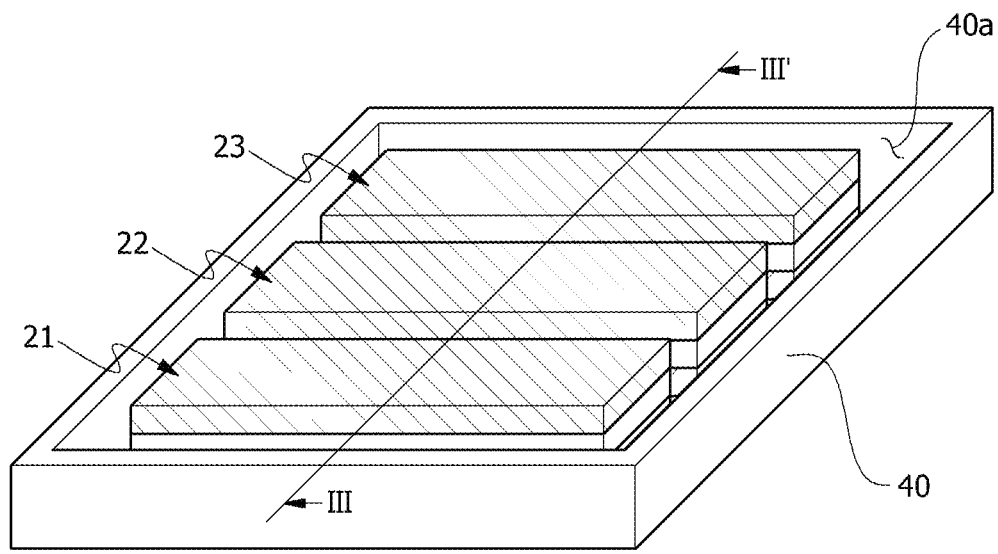
Figure 4D:
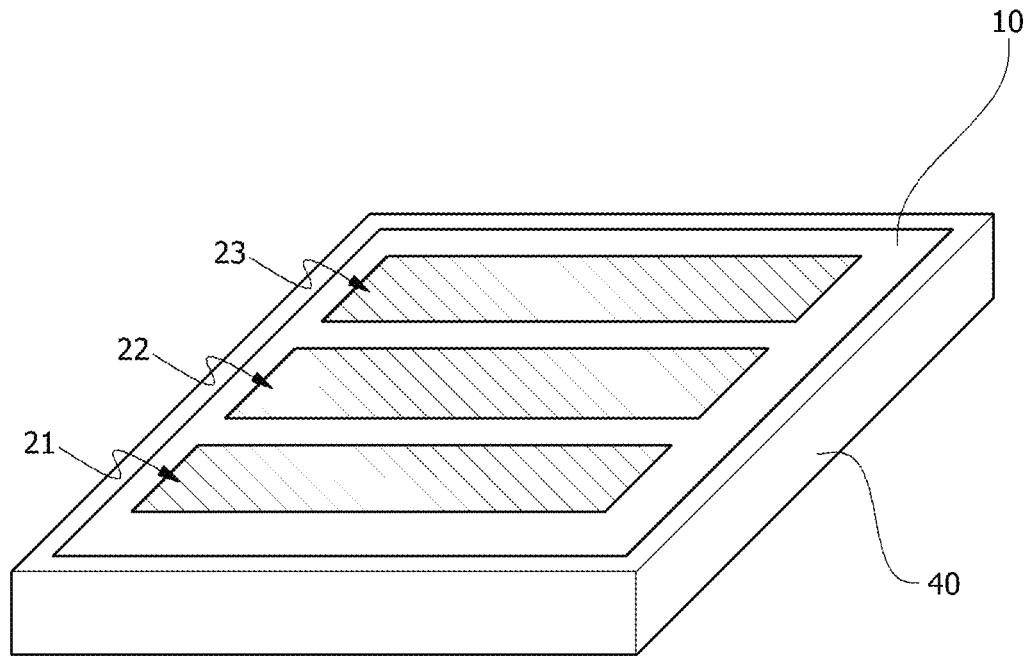
Figure 4E:
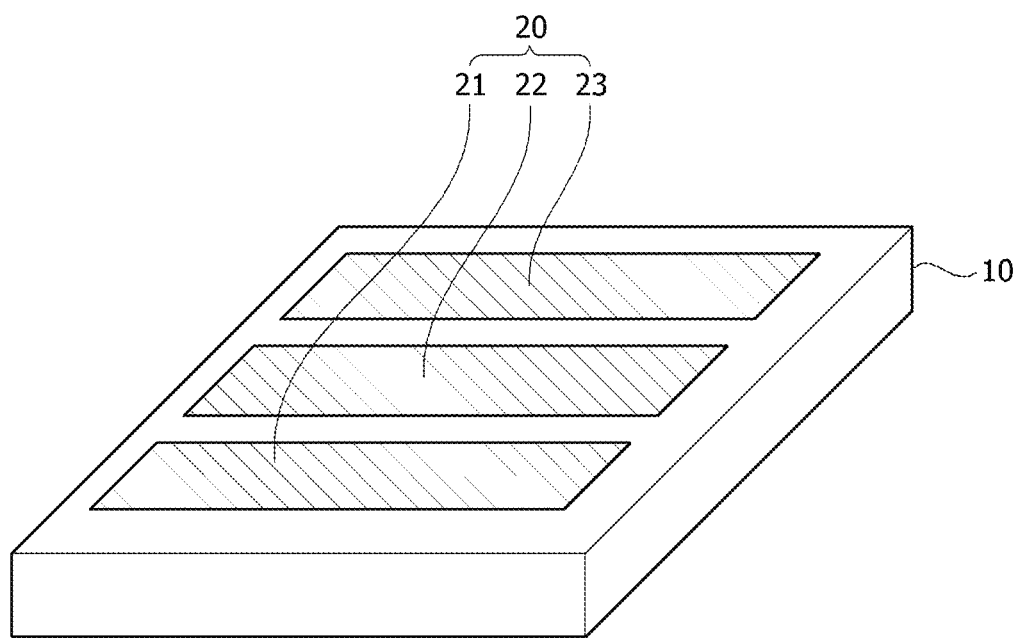
Figure 5A:
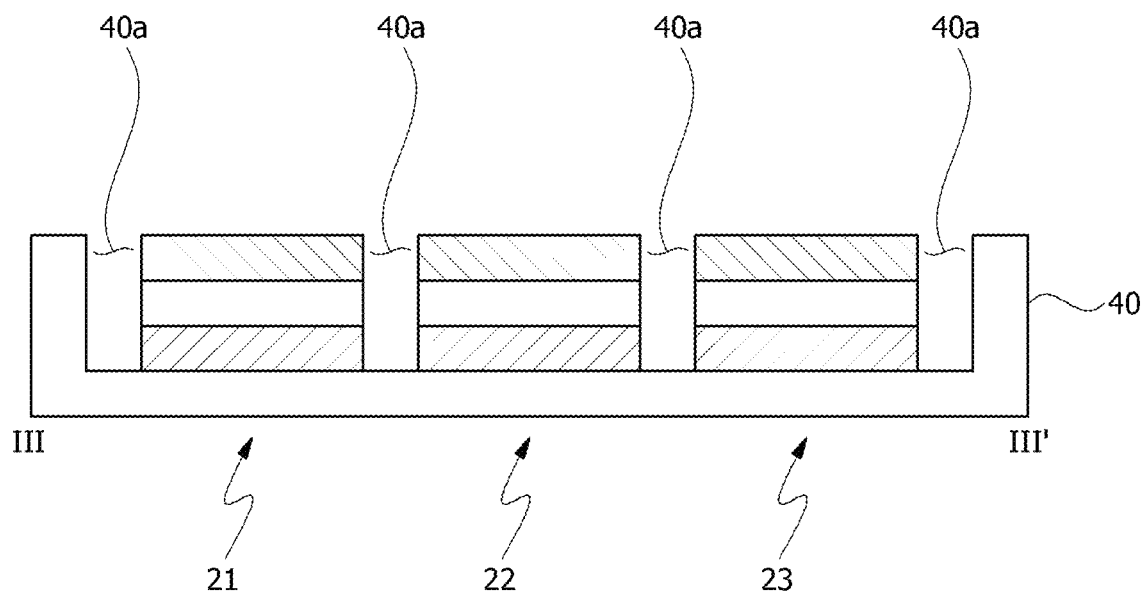
FIGS. 5A and 5B are cross-sectional views taken along line III-III' of FIG. 4C.
Figure 5B:
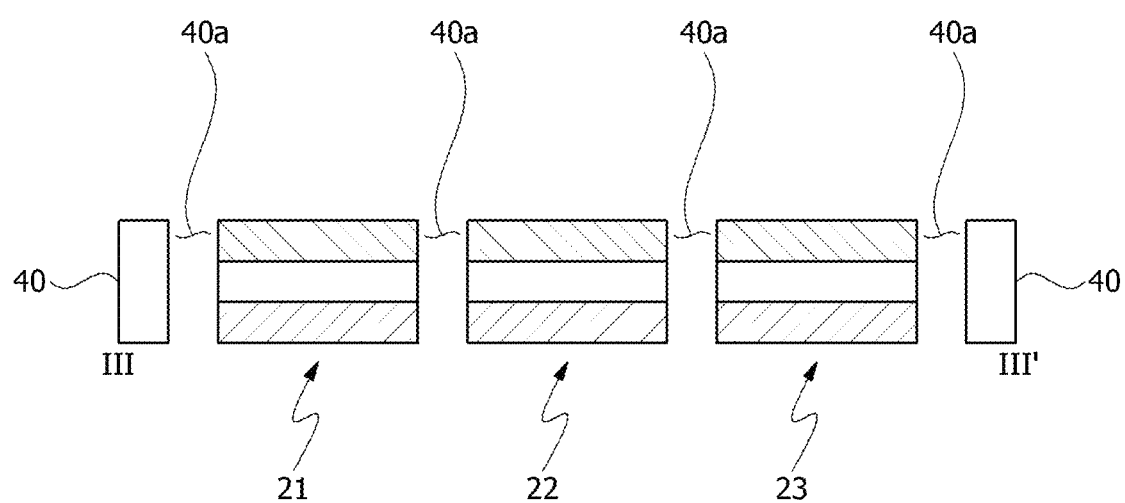

FIGS. 4A to 4E are perspective views illustrating a method of manufacturing a capacity sensor, according to another exemplary embodiment, and FIGS. 5A and 5B are cross-sectional views taken along line of FIG. 4C.

As shown in FIG. 4A, an electrode structure is formed by sequentially stacking a second electrode material 20c, a first dielectric material 20a, and a first electrode material 20b. As shown in FIG. 4B, the electrode structure is divided into at least two electrode units 21, 22, and 23. Each of the electrode units 21, 22, and 23 has a structure in which one of second electrode layers 21c, 22c, and 23c, one of dielectric layers 21a, 22a, and 23a, and one of first electrode layers 21b, 22b and 23b are sequentially stacked.

Next, as shown in FIG. 4C, first, second, and third electrode units 21, 22, and 23 are placed in a mold 40. In this case, the mold 40 is provided to form a structure. As shown in FIG. 5A, the first, second, and third electrode units 21, 22, and 23 may be placed on a bottom of a groove 40a formed in the mold 40. In addition, as shown in FIG. 5B, the mold 40 may have a frame shape only having an edge, by removing an entire bottom surface thereof. In this case, the first, second, and third electrode units 21, 22, and 23, and the mold 40 are placed on the same bottom surface.

As shown in FIG. 4D, a structure 10 is formed by filling the groove 40a of the mold 40 with a second dielectric material. In this case, the second dielectric material may be the same material as the dielectric layers 21a, 22a, and 23a of the electrode units 21, 22, and 23, but is not limited thereto. The structure 10 is formed such that upper surfaces of the first, second, and third electrode units 21, 22, and 23 are exposed.

Next, as shown in FIG. 4E, the structure 10 is formed by curing the second dielectric material. The mold 40 may be removed to manufacture a capacity sensor including the structure 10 and the first, second, and third electrode units 21, 22, and 23.

According to the above-described method of manufacturing the capacity sensor according to the exemplary embodiments of the present invention, since the structure 10 is formed using the first, second, and third electrode units 21, 22, and 23, a process can be more simplified.

Hereinafter, a direction detecting device including the capacity sensor according to the exemplary embodiments and a direction detecting method thereof will be described in detail with reference to the accompanying drawings.

Figure 6:
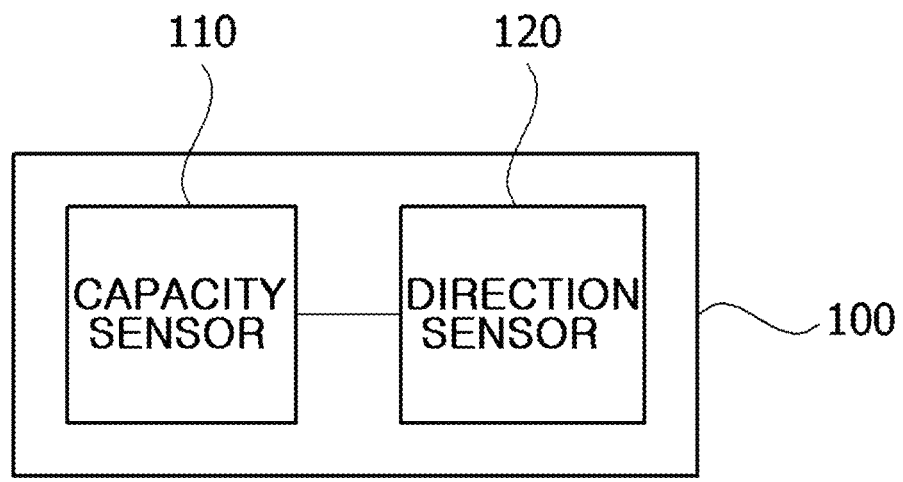
FIG. 6 is a block diagram illustrating a direction detecting device according to an exemplary embodiment of the present invention.
Figure 7:
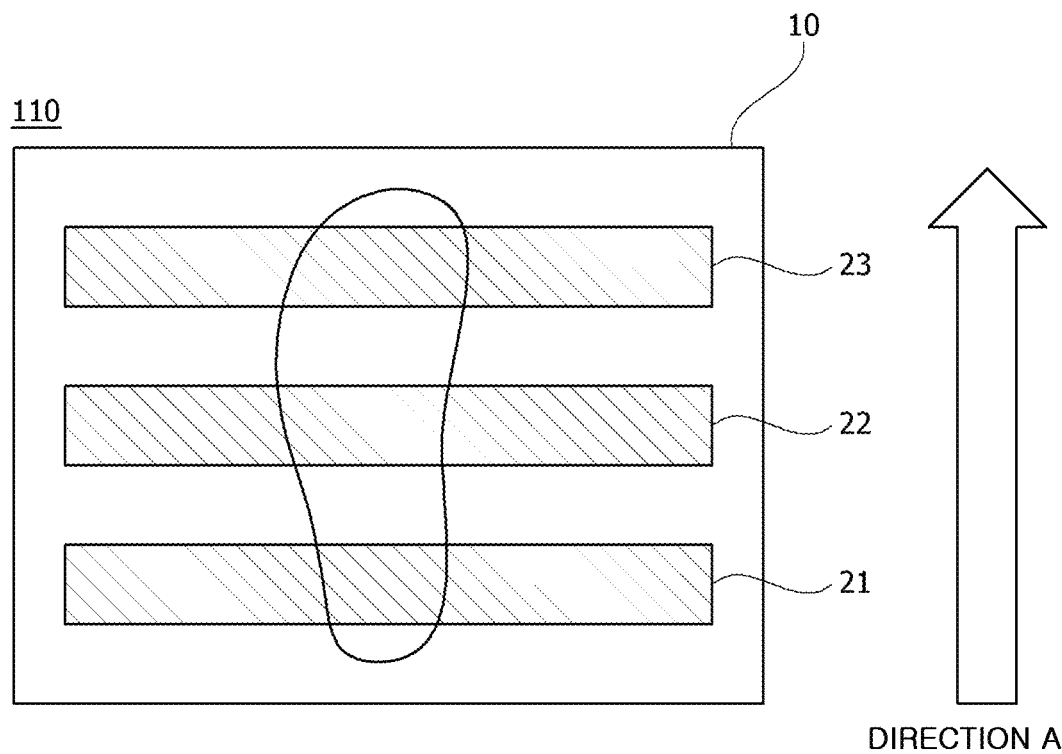
FIG. 7 is a plan view illustrating a movement direction.
Figure 8A:
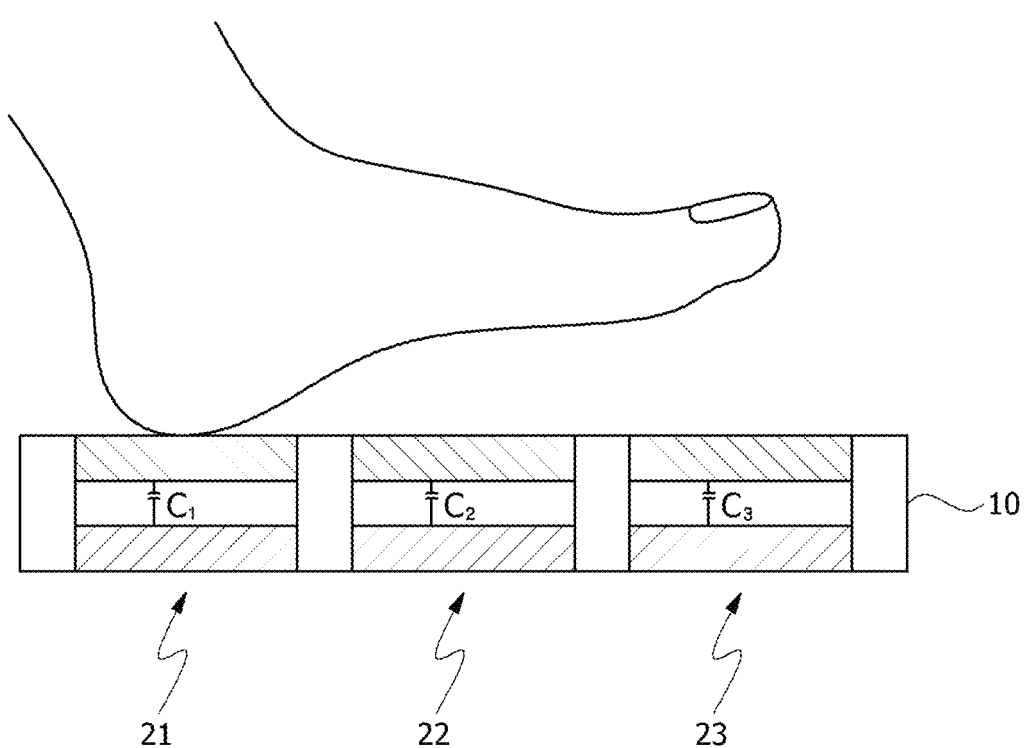
FIGS. 8A to 8C are cross-sectional views illustrating a change in capacitance according to the movement direction of FIG. 7.
Figure 8B:
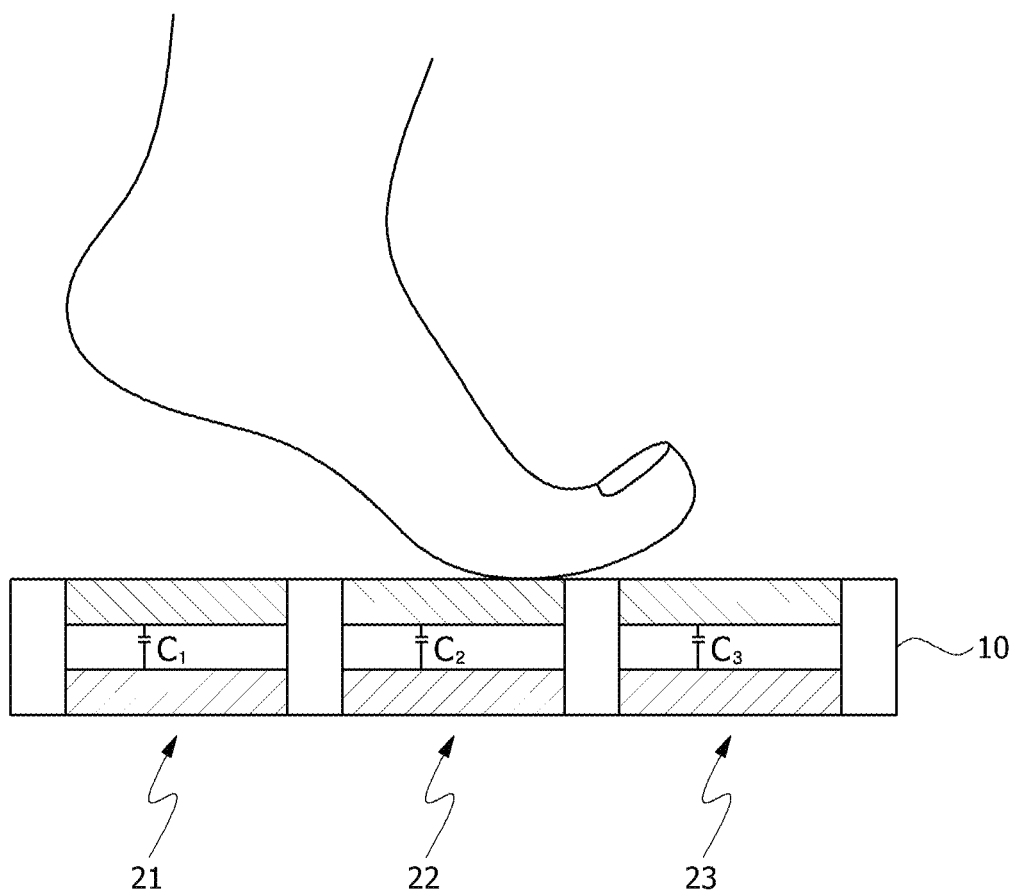
Figure 8C:
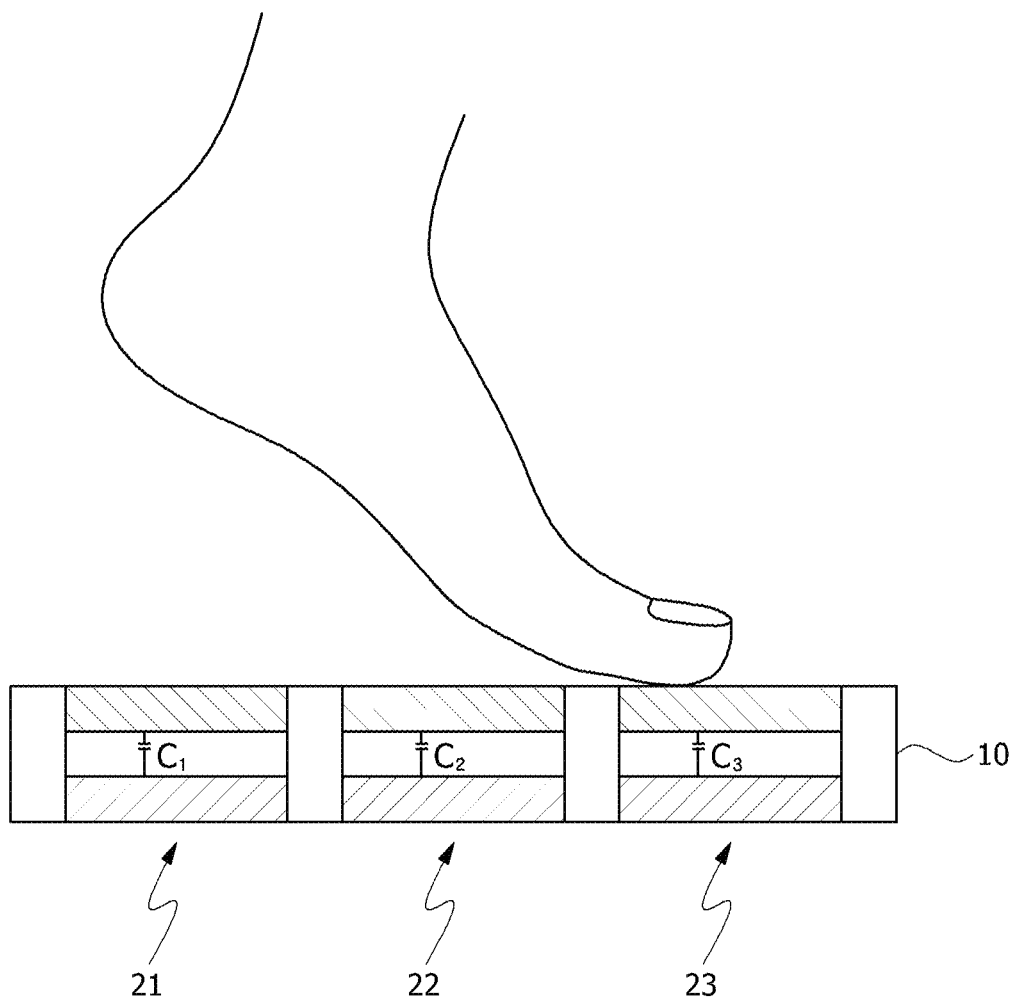

FIG. 6 is a block diagram illustrating a direction detecting device according to an exemplary embodiment of the present invention. FIG. 7 is a plan view illustrating a movement direction, and FIGS. 8A to 8C are cross-sectional views illustrating a change in capacitance according to the movement direction of FIG. 7.

As in FIG. 6, a direction detecting device 100 according to the embodiment includes a capacity sensor 110 and a direction sensor 120. Here, the capacity sensor 110 is the same as that described with reference to FIGS. 1 to 5. That is, the capacity sensor 110 includes at least two electrode units 21, 22, and 23 respectively inserted into the through-holes 10a, 10b, and 10c. The at least two electrode units 21, 22, and 23 include the dielectric layers 21a, 22a, and 23a, the first electrode layers 21b, 22b, and 23b disposed on the upper surfaces of the dielectric layers 21a, 22a, and 23a and exposed at the upper surface of the structure 10, and the second electrode layers 21c, 22c, 23c disposed on the lower surfaces of the dielectric layers 21a, 22a, and 23a and exposed at the lower surface of the structure 10. The direction sensor 120 is connected to the capacity sensor 110 to sense a movement direction.

Specifically, as shown in FIG. 7, a person may apply pressure to the capacity sensor 110 while moving in a direction A and walking through the capacity sensor 110. Here, a sole of the person applies pressure to at least two of the different electrode units 21, 22, and 23. That is, capacitance of the capacity sensor 110 is changed in at least two regions. For example, capacitance is changed in the first electrode unit 21 selected from a plurality of electrode units 21, 22, and 23, and the electrode unit 22 or 23 selected from the remaining electrode units 22 and 23 except the first electrode unit 21.

Specifically, the pressure is applied to two different electrode units of the electrode units 21, 22, and 23. Three electrode units 21, 22, and 23 are illustrated in the drawings as being sequentially pressed. Since pressure is sequentially applied to the first, second, and third electrode units 21, 22, and 23, capacitance of the first electrode unit 21, capacitance of the second electrode unit 22, and capacitance of the third electrode unit 23 are changed with time difference.

Specifically, as shown in FIG. 8A, capacitance C1 of the dielectric layer 21a is changed between the first electrode layer 21b and the second electrode layer 21c of the first electrode unit 21 at a first time T1. As shown in FIG. 8B, capacitance C2 of the dielectric layer 22a is changed between the first electrode layer 22b and the second electrode layer 22c of the second electrode unit 22 at a second time T2 (T2>T1). Finally, as shown in FIG. 8C, capacitance C3 of the dielectric layer 23a is changed between the first electrode layer 23b and the second electrode layer 23c of the third electrode unit 23 at a third time T3 (T3>T2).

The direction sensor 120 connected to the capacity sensor 110 may determine whether a person moves from the first electrode unit 21 to the third electrode unit 23, by receiving information on a region, capacitance of which is changed, the first electrode unit 21 indicating a region, capacitance of which is first changed, and the third electrode unit 23 indicating a region, capacitance of which is finally changed.

Figure 9A:
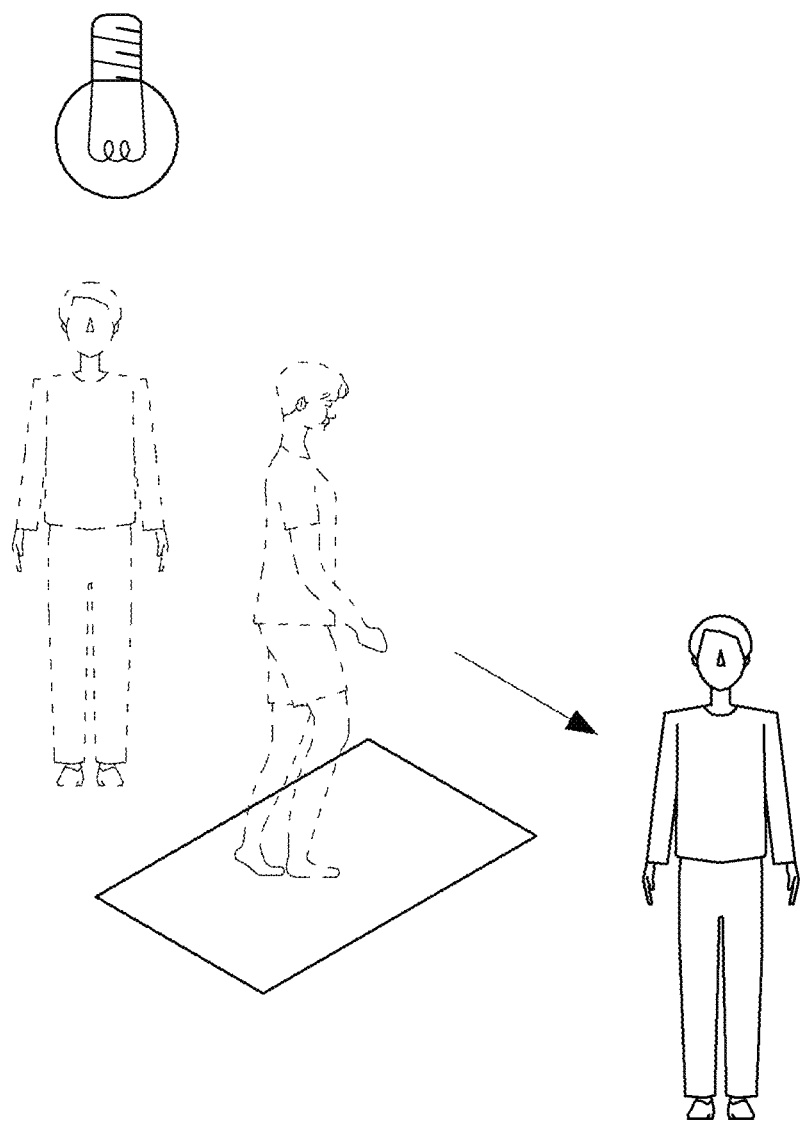
FIGS. 9A and 9B are views illustrating an example of an entry/exit sensing device including the direction detecting device according to the present invention.
Figure 9B:
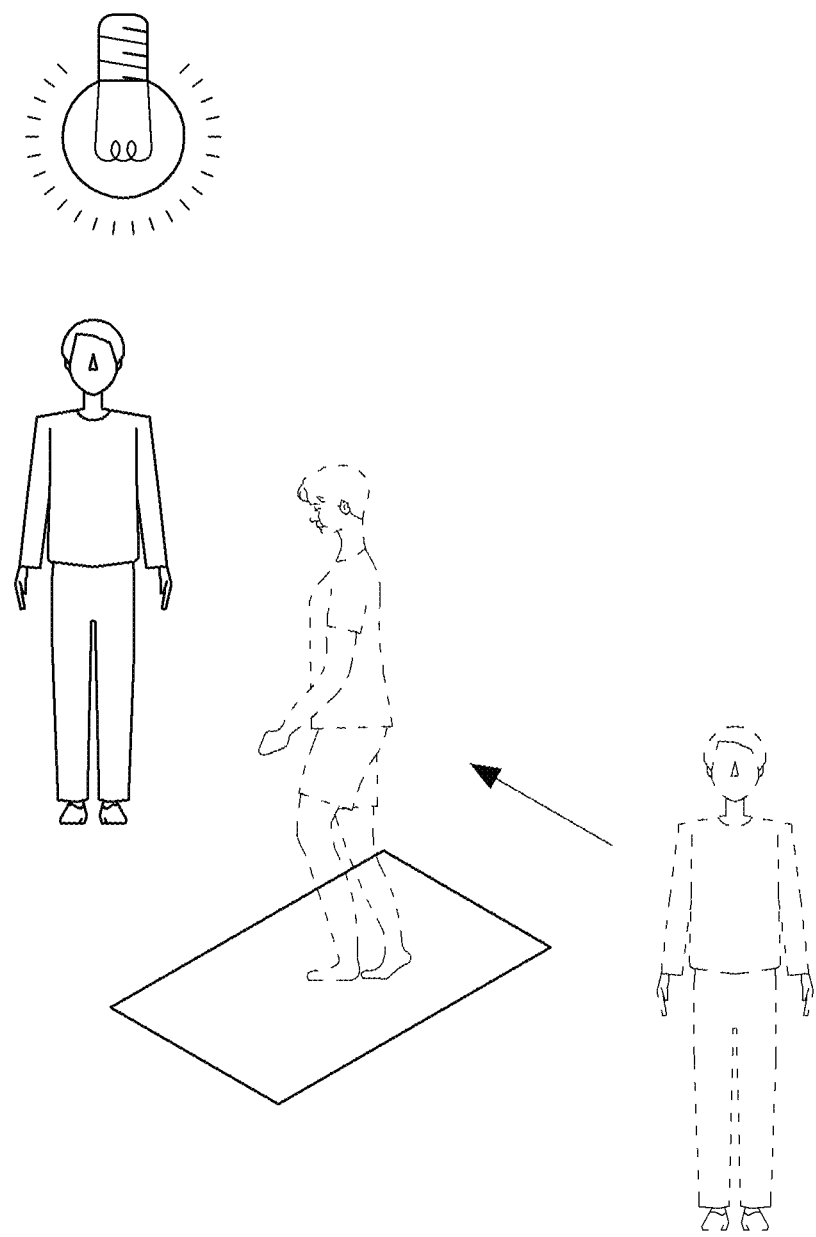

FIGS. 9A and 9B are views illustrating an example of an entry/exit sensing device including the direction detecting device according to the present invention.

As shown in FIG. 9A, in a case in which the direction detecting device 100 including the capacity sensor 110 is disposed in a mat or sheet structure at a front door, when a person applies pressure to the direction detecting device while leaving a room, capacitance of at least two of the electrode units of the capacity sensor 110 is changed. The direction sensor 120 may block electricity, a gas, or the like from being supplied to a building, by determining a movement direction of the person, i.e., whether the person leaves a room.

On the contrary, as shown in FIG. 9B, when a person applies pressure to a mat or a sheet while entering a room, capacitance of at least two of the electrode units of the capacity sensor 110 is changed. The direction sensor 120 may permit electricity, a gas, or the like to be supplied to a building, by determining a movement direction of the person, i.e., whether the person enters a room.

In particular, the capacity sensor 110 may distinguish whether a person is a child or an adult, based on pressure applied thereto. A control signal may be changed according to the distinction result. For example, when a child enters or leaves a room, a control signal may further include a viewing age limit for TV.

While the example embodiments of the present invention and their advantages have been described above in detail, it will be understood by those of ordinary skill in the art that various changes, substitutions and alterations may be made herein without departing from the scope of the present invention as defined by the following claims.

The invention claimed is:

1. A capacity sensor comprising:
   a structure having at least two through-holes each separately passing through an upper surface of the structure and through a lower surface of the structure; and
   at least two electrode units disposed in the at least two through-holes such that a first electrode unit of the electrode units is disposed in a first one of the at least two through-holes and a second electrode unit of the electrode units is disposed in a second one of the at least two through-holes,
   wherein each of the at least two electrode units comprises:
      a dielectric layer;
      a first electrode layer disposed on an upper surface of the dielectric layer and exposed at the upper surface of the structure to an outside of the structure; and
      a second electrode layer disposed on a lower surface of the dielectric layer and exposed at the lower surface of the structure to the outside of the structure.

2. The capacity sensor of claim 1, wherein a time at which capacitance of the dielectric layer of the first electrode unit is changed is different from a time at which capacitance of the dielectric layer of the second electrode unit is changed.

3. The capacity sensor of claim 1, wherein any one of an upper surface and a lower surface of the electrode unit has at least one of a bar shape, a zigzag shape, and a wave shape.

4. The capacity sensor of claim 1, wherein the first electrode unit is in complete contact with a side surface of the first one of the through-holes, and the second electrode unit is in complete contact with a side surface of the second one of the through-holes.

5. The capacity sensor of claim 1, wherein the at least two through-holes have the same width.

6. The capacity sensor of claim 1, wherein the at least two through-holes have different widths.

7. The capacity sensor of claim 1, wherein:
   the at least two electrode units comprise the first electrode unit and a third electrode unit disposed at an edge of the structure, and the second electrode unit disposed between the first electrode unit and the third electrode unit, and
   a width of each of the first electrode unit and the third electrode unit is smaller than a width of the second electrode unit.

8. The capacity sensor of claim 1, wherein the first one of the at least two through-holes is spaced apart from the second one of the at least two through-holes.

9. The capacity sensor of claim 8, wherein the first electrode unit is spaced apart from the second electrode unit.

10. The capacity sensor of claim 1, wherein the dielectric layer has a thickness of 0.5 mm to 30 mm.

11. A direction detecting device comprising:
a structure having at least two through-holes each separately passing through an upper surface of the structure and through a lower surface of the structure:
a capacity sensor comprising at least two electrode units disposed in the at least two through-holes such that a first electrode unit of the electrode units is disposed in a first one of the at least two through-holes and a second electrode unit of the electrode units is disposed in a second one of the at least two through-holes; and
a direction sensor connected to the capacity sensor to sense a movement direction,
wherein each of the at least two electrode units comprises:
a dielectric layer;
a first electrode layer disposed on an upper surface of the dielectric layer and exposed at the upper surface of the structure to an outside of the structure; and
a second electrode layer disposed on a lower surface of the dielectric layer and exposed at the lower surface of the structure to the outside of the structure.

12. The direction detecting device of claim 11, wherein the direction sensor determines that an object moves toward an electrode unit, in which a change in capacitance occurs later than other electrode units, of the at least two electrode units.

13. The direction detecting device of claim 11, wherein a time at which capacitance of the dielectric layer of the first electrode unit is changed is different from a time at which capacitance of the dielectric layer of the second electrode unit is changed.

14. The direction detecting device of claim 13, wherein, when the capacitance of the dielectric layer of the first electrode unit is changed at a first time (T1) and the capacitance of the dielectric layer of the second electrode unit of the at least two electrode units is changed at a second time (T2) (here, T2>T1), it is determined that an object moves from the first electrode unit to the second electrode unit.

15. The direction detecting device of claim 11, wherein an upper surface of the electrode unit has a shape selected from a bar shape, a zigzag shape, and a wave shape.

16. The direction detecting device of claim 11, wherein the first electrode unit is in complete contact with a side surface of the first one of the through-holes, and the second electrode unit is in complete contact with a side surface of the second one of the through-holes.

17. The direction detecting device of claim 11, wherein the at least two through-holes have the same width.

18. The direction detecting device of claim 11, wherein the at least two through-holes have different widths.

19. The direction detecting device of claim 11, wherein:
the at least two electrode units comprise the first electrode unit and a third electrode unit disposed at an edge of the structure, and the second electrode unit disposed between the first electrode unit and the third electrode unit; and
a width of each of the first electrode unit and the third electrode unit is smaller than a width of the second electrode unit.

20. The direction detecting device of claim 11, wherein the first one of the at least two through-holes is spaced apart from the second one of the at least two through-holes, and the first electrode unit is spaced apart from the second electrode unit.

* * * * *